(12) United States Patent
Ishii et al.

(10) Patent No.: US 9,099,359 B2
(45) Date of Patent: Aug. 4, 2015

(54) DISPLAY DEVICE AND METHOD FOR MANUFACTURING DISPLAY DEVICE

(75) Inventors: Miyo Ishii, Chiba (JP); Manabu Yamashita, Mobara (JP); Osamu Karikome, Katsuura (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 13/562,364

(22) Filed: Jul. 31, 2012

(65) Prior Publication Data

US 2013/0032832 A1 Feb. 7, 2013

(30) Foreign Application Priority Data

Aug. 3, 2011 (JP) ................... 2011-169763

(51) Int. Cl.
*H01L 27/12* (2006.01)

(52) U.S. Cl.
CPC ........ *H01L 27/1244* (2013.01); *H01L 27/1248* (2013.01); *H01L 27/1288* (2013.01)

(58) Field of Classification Search
CPC ............... H01L 21/76804; H01L 27/1248; H01L 27/1244
USPC .......................................... 257/774
See application file for complete search history.

(56) References Cited

U.S. PATENT DOCUMENTS

| | | | |
|---|---|---|---|
| 2004/0166668 A1 | 8/2004 | Ito | |
| 2008/0061446 A1* | 3/2008 | You | ................ 257/774 |
| 2009/0250701 A1 | 10/2009 | Kimura | |
| 2011/0297930 A1* | 12/2011 | Choi et al. | ............ 257/43 |
| 2012/0248467 A1 | 10/2012 | Yokoyama et al. | |
| 2013/0210312 A1 | 8/2013 | Fujioka et al. | |

FOREIGN PATENT DOCUMENTS

| | | |
|---|---|---|
| JP | 62-133722 | 6/1987 |
| JP | 02-168612 | 6/1990 |
| JP | 04-005857 | 1/1992 |
| JP | 11-067908 | 3/1999 |
| JP | 2001-174849 | 6/2001 |
| JP | 2002-108244 | 4/2002 |
| JP | 2004-282041 | 10/2004 |
| JP | 2010-20190 | 1/2010 |
| JP | 2012-216495 | 11/2012 |
| WO | WO 2007/017982 | 2/2007 |
| WO | WO 2007/148540 | 12/2007 |

* cited by examiner

*Primary Examiner* — Colleen A Matthews
*Assistant Examiner* — Christopher Johnson
(74) *Attorney, Agent, or Firm* — Lowe Hauptman & Ham, LLP (57) ABSTRACT

A display device includes an electrode layer formed at a predetermined position on a substrate, an insulating film having a through-hole formed on the top of the electrode layer, and a wiring film connected to the electrode layer via the through-hole formed in the insulating film. Based on a surface of the substrate, the through-hole includes a first taper portion having a first taper angle, a second taper portion formed higher than the first taper portion and having a second taper angle different from the first taper angle, and a third taper portion formed higher than the second taper portion and having a third taper angle different from the second taper angle.

7 Claims, 7 Drawing Sheets

DISPLAY DEVICE AND METHOD FOR MANUFACTURING DISPLAY DEVICE

CROSS-REFERENCE TO RELATED APPLICATION

The present application claims priority from Japanese Applications JP2011-169763 filed on Aug. 3, 2011, the content to which is hereby incorporated by reference into this application.

BACKGROUND OF THE INVENTION

1. Field of the Invention

The present invention relates to a display device and a method for manufacturing a display device.

2. Description of the Related Art

For example, in display devices such as liquid crystal display devices, a so-called contact hole is sometimes used as a structure for electrically connecting conductive films formed in different layers with each other, such as wirings, via an insulating layer formed above a substrate. Specifically, for example, when a wiring formed in a layer where a gate electrode is formed is electrically connected with a wiring formed in a layer where a drain electrode is formed, a contact hole extending from the top of the substrate to the top of the wiring formed in the layer where the gate electrode is formed and a contact hole extending from the top of the substrate to the top of the wiring formed in the layer where the drain electrode is formed are formed in the insulating layer, and the wirings are electrically connected with each other with a conductive film stacked on the substrate (JP 2010-20190 A).

SUMMARY OF THE INVENTION

In general, a method shown in FIGS. 7A to 7H is considered as a method for forming, on a substrate, a TFT (Thin Film Transistor) and a through-hole (gate through-hole) of a gate insulating film as a contact hole for connecting a wiring portion.

Figure 7A:
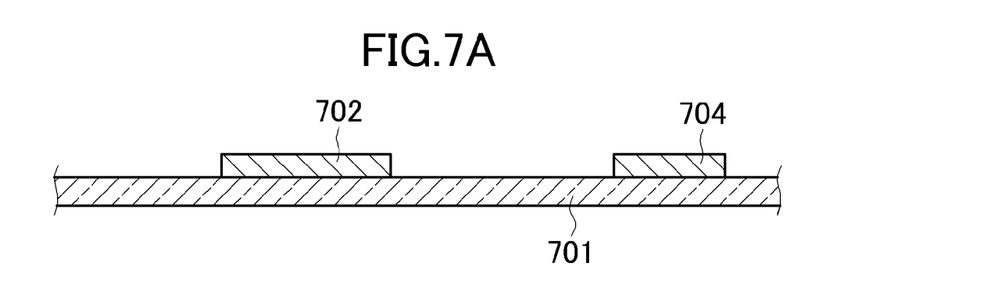
FIG. 7A explains problems addressed by the invention.
Figure 7B:
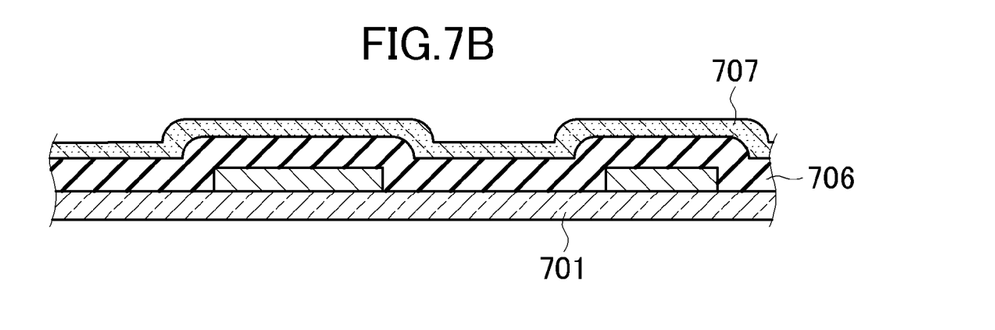
FIG. 7B explains the problems addressed by the invention.

First, as shown in FIG. 7A, a gate electrode 702 for forming a TFT and an electrode 704 formed in the same layer as the gate electrode by the same process as the gate electrode are formed on a glass substrate 701. Specifically, for example, a metal layer formed of Al or Mo is deposited on the glass substrate 701 using a sputtering apparatus. Then, the gate electrode 702 and the electrode 704 are processed as shown in FIG. 7A by a well-known photolithography process and an etching process. Next, as shown in FIG. 7B, a gate insulating film 706 is deposited, and a semiconductor layer 707 is formed.

Figure 7C:
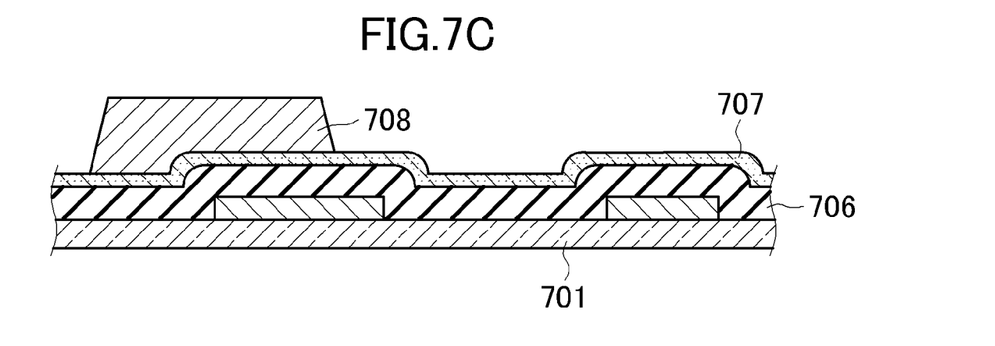
FIG. 7C explains the problems addressed by the invention.

Next, a resist is applied, and thereafter a mask (not shown) on which an opening is patterned is aligned with the glass substrate 701. Then, exposure (mainly visible light) is performed by irradiating the mask with light. In this case, a portion corresponding to the opening is irradiated, but a portion except for the portion corresponding to the opening is not irradiated. Thereafter, the resist at an unnecessary portion is removed (development). As a result, a resist 708 in an area for forming the TFT remains as shown in FIG. 7C.

Figure 7D:
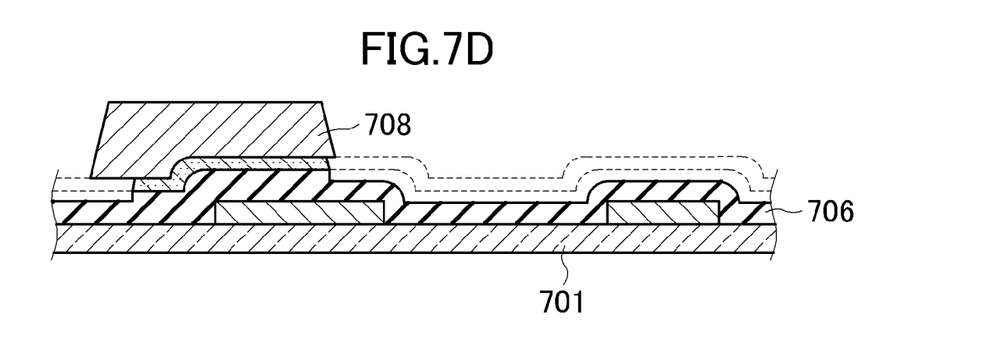
FIG. 7D explains the problems addressed by the invention.
Figure 7E:
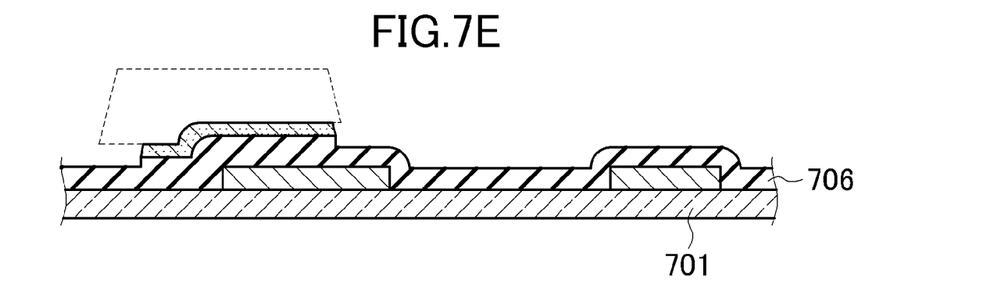
FIG. 7E explains the problems addressed by the invention.

Next, as shown in FIG. 7D, the semiconductor layer 707 at a portion other than the portion for forming the TFT is removed by etching. In this case, the top of the gate insulating layer 706 is also partially removed. Thereafter, as shown in FIG. 7E, the remaining resist 708 is removed.

Figure 7F:
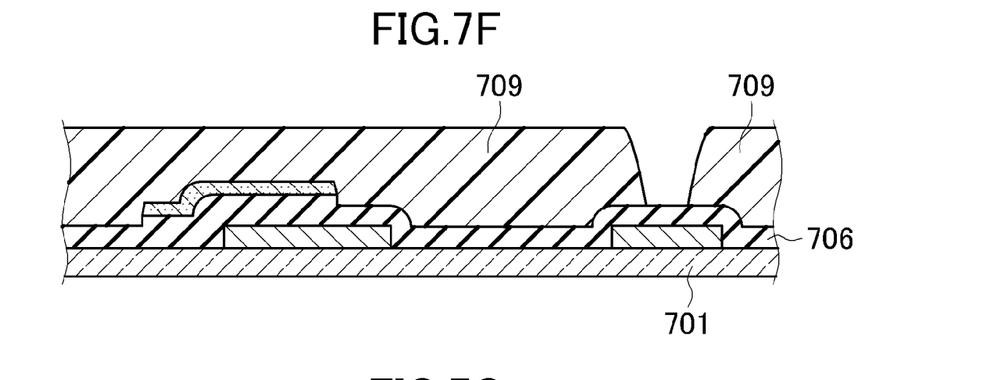
FIG. 7F explains the problems addressed by the invention.
Figure 7G:
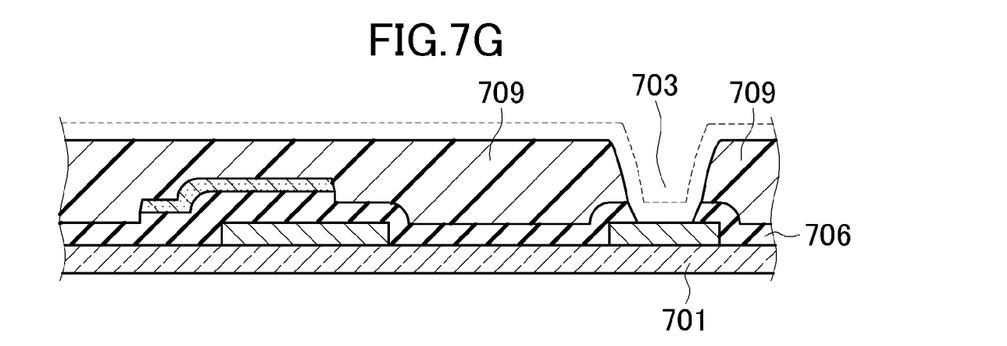
FIG. 7G explains the problems addressed by the invention.
Figure 7H:
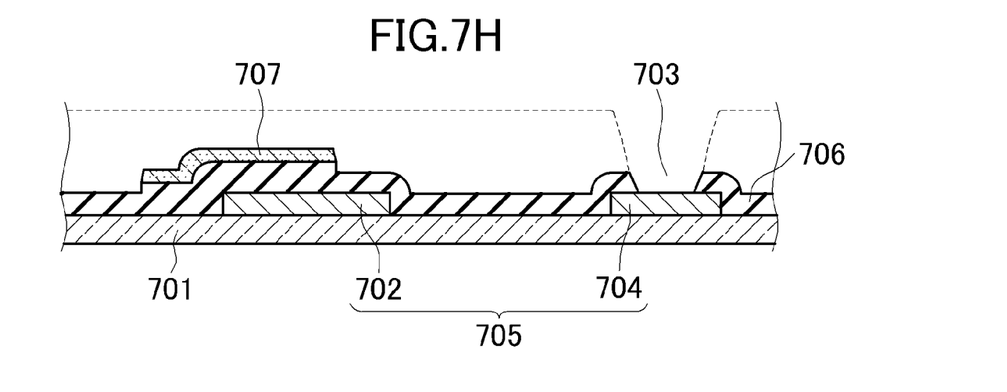
FIG. 7H explains the problems addressed by the invention.

Next, as shown in FIG. 7F, a resist is applied, and thereafter a mask on which an opening is patterned is aligned with the glass substrate 701. The opening corresponds to an area for forming the gate through-hole, so that it is needless to say that the mask has a pattern different from that of the mask described above. Then, the mask is irradiated with light (exposure). In this case, a portion corresponding to the opening is irradiated, and a portion other than the portion corresponding to the opening is not irradiated. Thereafter, the resist at an unnecessary portion is removed (development). As a result, the resist at the portion corresponding to the gate through-hole is removed. Then, as shown in FIG. 7G, the gate insulating film 706 in the area corresponding to the gate through-hole 703 is removed by etching. In this case, the top of the resist 709 is also partially scraped. Thereafter, as shown in FIG. 7H, the remaining resist 709 is removed.

Thereafter, source and drain electrodes (not shown) for forming the TFT and a wiring portion (not shown) to be connected to the gate electrode layer 705 via the gate through-hole 703 are formed through a photolithography process and an etching process. As described above, the gate through-hole 703 for connecting the electrode 704 with the wiring portion can be formed above the glass substrate 701.

However, when the method described above is used, the number of so-called photolithography processes is increased. As a result, the number of processes in the manufacturing process of a TFT or the like is increased. Moreover, when the gate through-hole 703 formed as described above is used, a crack occurs (depending on a taper angle) in the wiring portion stacked on the top of the electrode 704 below the gate through-hole 703, and the crack progresses by a reliability test, which may result in connection failure. Moreover, especially at an edge of the gate through-hole 703, a short of the wiring portion sometimes occurs.

In view of the problems described above, it is an object of one or more embodiments of the invention to realize a display device in which the number of photolithography processes can be further reduced and which can more effectively prevent contact failure due to insufficient coverage of a wiring portion at a gate through-hole or a short of the wiring portion at an edge of the through-hole, and a method for manufacturing the display device.

(1) In one or more embodiments of the present invention, a display device includes an electrode layer formed at a predetermined position on a substrate, an insulating film having a through-hole formed on the top of the electrode layer, and a wiring film connected to the electrode layer via the through-hole formed in the insulating film. Based on a surface of the substrate, the through-hole includes a first taper portion having a first taper angle, a second taper portion formed higher than the first taper portion and having a second taper angle different from the first taper angle, and a third taper portion formed higher than the second taper portion and having a third taper angle different from the second taper angle.

(2) In the display device of the present invention according to (1), the first taper angle is greater than the second taper angle.

(3) In the display device of the present invention according to (1), the third taper angle is greater than the second taper angle.

(4) In the display device of the present invention according to (1), the second taper angle is 10° or less.

(5) In the display device of the present invention according to (1), the diameter of the through-hole at a portion contacting the electrode layer is 7.6 μm or less.

(6) In the display device of the present invention according to (1), the through-hole is arranged in a frame area positioned at the periphery of a display area of the display device.

(7) In one or more embodiments of the present invention, a method for manufacturing a display device including a thin film transistor and a through-hole includes forming an electrode layer having a predetermined shape on a substrate, forming an insulating film on the substrate and on the electrode layer, forming a semiconductor layer on the insulating film, forming a resist having at least two different thicknesses on the semiconductor layer, and removing by etching a portion of the semiconductor layer. The portion is in an area for forming a through-hole. The method also includes removing the resist formed in an area other than an area for forming the thin film transistor, etching the semiconductor layer to remove the semiconductor layer in the area other than the area for forming the thin film transistor and to form the through-hole, and forming a wiring layer and source and drain electrodes on the top of the gate through-hole and on the semiconductor layer in the area for forming the thin film transistor.

(8) In the display device of the present invention according to (7), an exposure mask used in the forming of the resist that has the at least two different thicknesses is a half exposure mask including a half transmission area that blocks approximately one-half of light.

DETAILED DESCRIPTION OF THE INVENTION

Hereinafter, an embodiment of the invention will be described with reference to the drawings. For the drawings, the same or equivalent constituents are denoted by the same reference and numeral signs, and the repetitive description thereof will be omitted.

Figure 1:
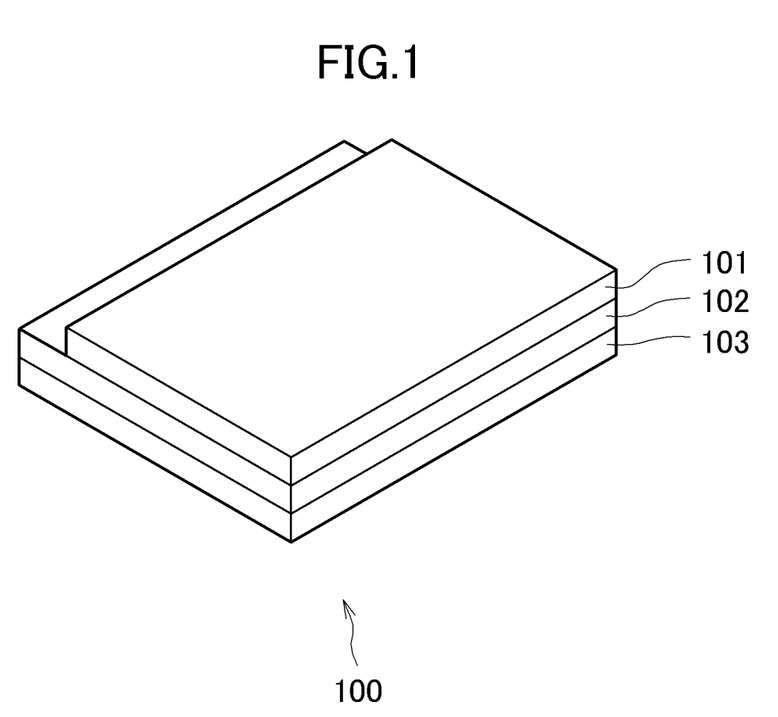
FIG. 1 is a schematic view showing a display device according to an embodiment of the invention.

FIG. 1 is a schematic view showing a display device according to the embodiment of the invention. As shown in FIG. 1, for example, the display device 100 has a TFT substrate 102 on which TFTs and the like (not shown) are formed and a filter substrate 101 which faces the TFT substrate 102 and on which a color filter (not shown) is disposed. Moreover, the display device 100 has a liquid crystal material (not shown) sealed in an area interposed between the TFT substrate 102 and the filter substrate 101 and a backlight 103 positioned in contact with the side of the TFT substrate 102 opposed to the filter substrate 101.

Figure 2:
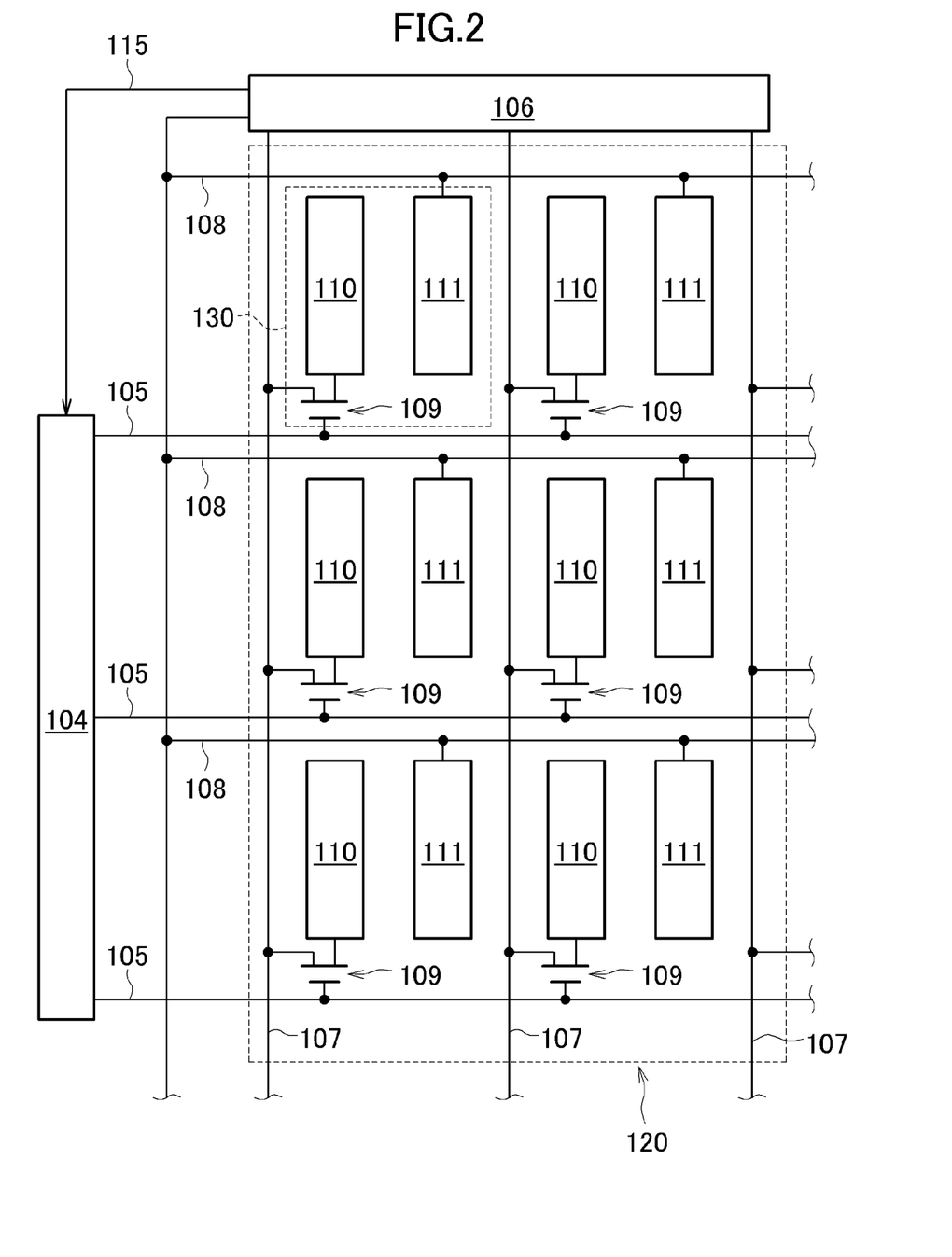
FIG. 2 is a conceptual view of a pixel circuit formed on a TFT substrate shown in FIG. 1.

FIG. 2 is a conceptual view of a pixel circuit formed on the TFT substrate shown in FIG. 1. As shown in FIG. 2, the TFT substrate 102 has a plurality of gate signal lines 105 arranged in the lateral direction of FIG. 2 and a plurality of video signal lines 107 arranged in the longitudinal direction of FIG. 2. Moreover, the gate signal lines 105 are connected to a gate driver 104, and the video signal lines 107 are connected to a drain driver 106.

The gate driver 104 has a shift register circuit composed of a plurality of basic circuits (not shown) respectively corresponding to the plurality of gate signal lines 105. Each of the basic circuits is configured to include a plurality of TFTs and capacitances. The basic circuit outputs, to the corresponding gate signal line 105, a gate signal as a high voltage in a scanning period of the corresponding gate signal line 105 in one frame period according to a control signal 115 supplied from the drain driver 106 for example.

Each of pixel areas 130 forming a pixel area 120 defined in a matrix by the gate signal lines 105 and the video signal lines 107 has a TFT 109, a pixel electrode 110, and a common electrode 111. The gate of the TFT 109 is connected to the gate signal line 105, one of the source and drain thereof is connected to the video signal line 107, and the other is connected to the pixel electrode 110. Moreover, the common electrode 111 is connected to a common signal line 108. The pixel electrode 110 and the common electrode 111 are arranged so as to face each other.

Next, the outline of operation of the pixel circuit configured as described above will be described. For example, the drain driver 106 applies a reference voltage to the common electrode 111 via the common signal line 108. Moreover, the gate driver 104 outputs a gate signal to the gate of the TFT 109 via the gate signal line 105. Further, the drain driver 106 supplies the TFT 109 to which the gate signal is output with a voltage of a video signal via the video signal line 107, and applies the voltage of the video signal to the pixel electrode 110 via the TFT 109. In this case, a potential difference is generated between the pixel electrode 110 and the common electrode 111.

Then, liquid crystal molecules of the liquid crystal material intervening between the pixel electrode 110 and the common electrode 111 are driven by the potential difference generated between the pixel electrode 110 and the common electrode 111. Thus, the transmittance ratio of light from the backlight 103 is controlled. As a result, an image can be displayed.

Figure 3:
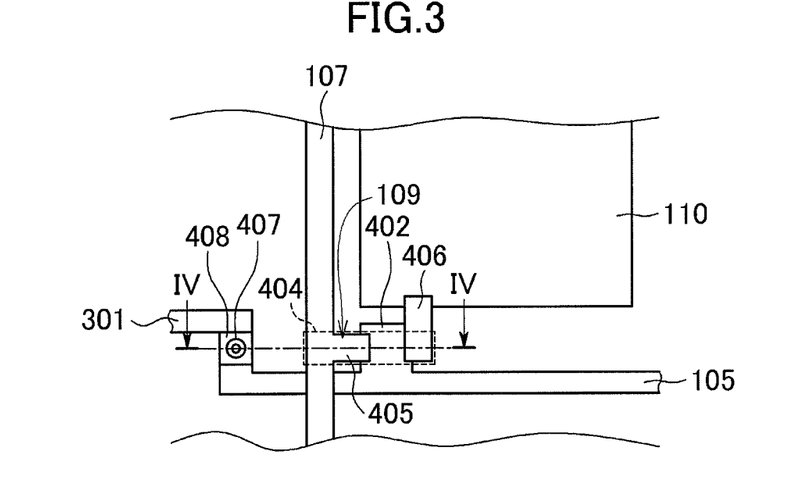
FIG. 3 schematically shows a partial top of a TFT and its surroundings, the TFT being adjacent to a frame area among TFTs shown in FIG. 2.

FIG. 3 schematically shows a partial top of a TFT and its surroundings, the TFT being adjacent to a frame area among TFTs shown in FIG. 2. The frame area corresponds to an area positioned at the periphery of the pixel area 120 in the TFT substrate 102. For example, the frame area is an area where the gate driver 104 or the driver 106 is formed. The top view shown in FIG. 3 is illustrative only, and the embodiment is not limited to this.

As shown in FIG. 3, for example, the TFT 109 is formed at a portion where the gate signal line 105 and the video signal line 107 cross. The TFT 109 includes a gate electrode 402 formed to extend from the gate signal line 105, a semiconductor layer 404 arranged above the gate electrode 402, and a drain electrode 405 and a source electrode 406 both arranged on the top of the semiconductor layer 404. The drain electrode 405 corresponds to, for example, a part of the video signal line 107. Moreover, the source electrode 406 is connected to the pixel electrode 110. The gate signal line 105 extends to the frame area to be connected to a wiring portion 408 via a gate through-hole 407. Moreover, for example, the wiring portion 408 is further connected to the gate driver 104 using an ITO 301 stacked on the wiring portion 408. The configurations of the TFT 109, the gate through-hole 407, and the like will be described in detail later.

Figure 4:
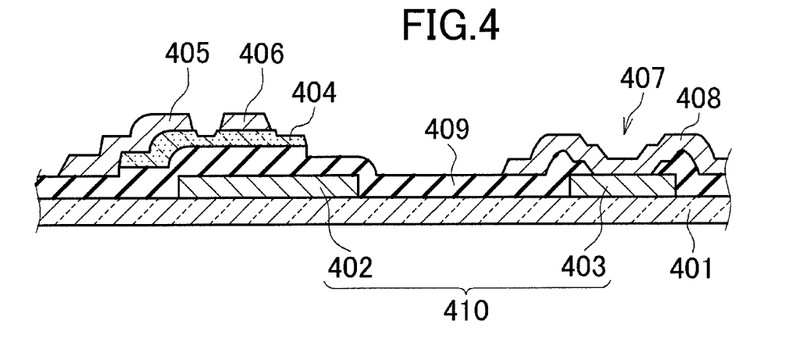
FIG. 4 is an enlarged view of a IV-IV section of FIG. 3.

FIG. 4 is an enlarged view of a IV-IV section of FIG. 3. In FIG. 4, an area for forming the TFT and an area for forming the gate through-hole are inversely illustrated. As shown in FIG. 4, a gate electrode layer 410, which includes the gate electrode 402 and an electrode 403 respectively in the area for forming the TFT 109 and the area for forming the gate through-hole 407, is arranged on a substrate 401. Moreover, a gate insulating film 409 is arranged so as to cover the substrate 401 on which the gate electrode layer 410 is arranged. As the substrate 401, for example, a glass substrate is used.

The gate insulating film 409 arranged on the top of the gate electrode layer 410 has the gate through-hole 407 through which the wiring portion 408 is connected with the gate electrode layer 410. The shape and the like of the gate insulating film 409 in which the gate through-hole 407 is formed will be described in detail later.

On the gate insulating film 409, a wiring layer for forming the wiring portion 408 is arranged. In this case, the wiring layer is in contact with an upper surface of the electrode 403 via the gate through-hole 407. That is, in the area where the gate through-hole 407 is formed, a lower portion of the wiring portion 408 is in contact with the upper portion of the electrode 403. Thus, the wiring portion 408 is connected to the electrode 403.

On the other hand, in the area where the TFT 109 is formed, the gate insulating film 409 is similarly arranged on the gate electrode 402. On the gate insulating film 409, the semiconductor layer 404 is formed so as to overlap with at least a portion of the gate electrode layer 410. On the semiconductor layer 404, source/drain electrode layer for forming the source electrode 406 and the drain electrode 405 is arranged. As will be described later, the source/drain electrode layer and the wiring layer are formed of the same material.

Figure 5:
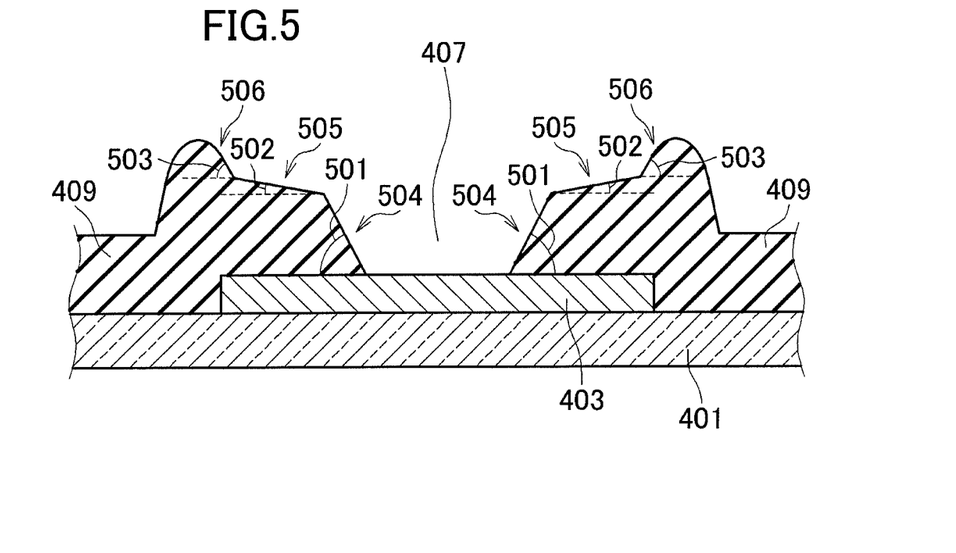
FIG. 5 explains a cross-sectional configuration of a gate insulating film at both edges of a gate through-hole.

Next, with reference to FIG. 5, a cross-sectional configuration of the gate insulating film 409 in which the gate through-hole 407 is formed will be described in detail. FIG. 5 explains the cross-sectional configuration of the gate insulating film at both edges of the gate through-hole.

As shown in FIG. 5, the gate insulating film 409 has, from the inner side of the gate through-hole 407 toward the upper side in the drawing, a first taper portion 504, a second taper portion 505, and a third taper portion 506 in this order. Specifically, the first taper portion 504, the second taper portion 505, and the third taper portion 506 have a first taper angle 501, a second taper angle 502, and a third taper angle 503, respectively, relative to the horizontal direction in the drawing.

The first taper angle 501 is greater than the second taper angle 502. Moreover, the third taper angle 503 is also greater than the second taper angle 502. The second taper angle 502 is desirably formed to be 10° or less relative to the horizontal direction. Moreover, for example, the thickness from the upper surface of the electrode 403 to the uppermost portion of the gate through-hole 407 is about 270 nm, the thickness of the first taper portion 504 is about 140 nm, and the thickness of the second taper portion 505 is about 10 to 20 nm. Moreover, the dimension (diameter) of the gate through-hole in the upper surface of the electrode 403 is desirably about 7.6 μm or less.

By forming the gate through-hole 407 as described above, the aspect ratio of the gate through-hole 407 (the film thickness of the gate insulating film 409/the dimension of the gate through-hole 407) can be reduced. Specifically, the aspect ratio of the gate through-hole 407 can be reduced to about 0.02 or less, so that the aspect ratio can be improved greatly compared to an aspect ratio of 0.04 or more in the related art. As a result, the coverage of the wiring portion 408 relative to the gate electrode 402, the wiring portion 408 being arranged via the gate through-hole 407, can be made favorable, so that the problem of contact failure relative to the top of the electrode 403 can be mended. Moreover, since the first taper angle 501, the second taper angle 502, and the third taper angle 503 have the relation described above, a short of the wiring portion 408, especially a short of the wiring portion 408 at a portion where the wiring portion 408 rides up from the first taper portion 504 onto the second taper portion 505 can be more effectively prevented.

Next, with reference to FIGS. 6A to 6H, a method for manufacturing the TFT and the gate through-hole in the embodiment will be described. The manufacturing method shown in FIGS. 6A to 6H is illustrative only. It is needless to say that substantially the same method as the manufacturing method, a method providing substantially the same operational effect, or the like may be used.

Figure 6A:
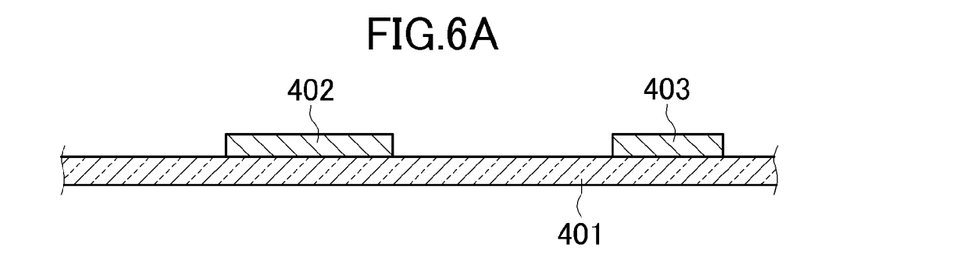
FIG. 6A explains a method for manufacturing a TFT and a gate through-hole in the embodiment.

First, as shown in FIG. 6A, the gate electrode layer 410 for forming the gate electrode 402 and the electrode 403 is formed on the substrate 401. Specifically, for example, the gate electrode layer 410 is deposited on the substrate 401 using a sputtering apparatus. Then, the gate electrode layer 410 is processed into an island-like shape shown in FIG. 6A by well-known photolithography and etching. As the gate electrode layer 410, for example, MoCr/AlNd is used.

Figure 6B:
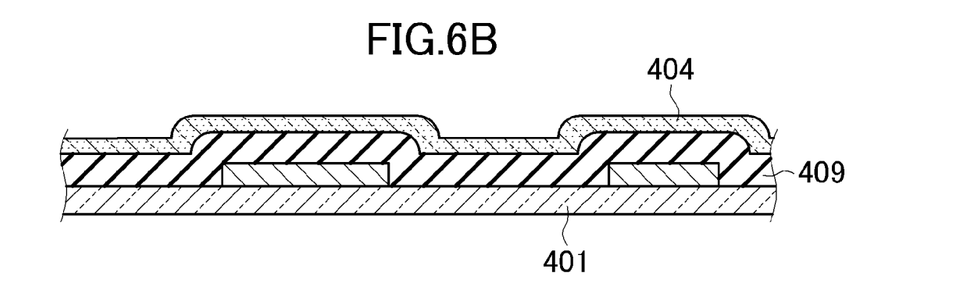
FIG. 6B explains the method for manufacturing the TFT and the gate through-hole in the embodiment.

Next, as shown in FIG. 6B, the gate insulating film 409 is deposited, and the semiconductor layer 404 is formed. For example, SiN is used as the gate insulating film 409, and a-Si is used as the semiconductor layer 404.

Figure 6C:
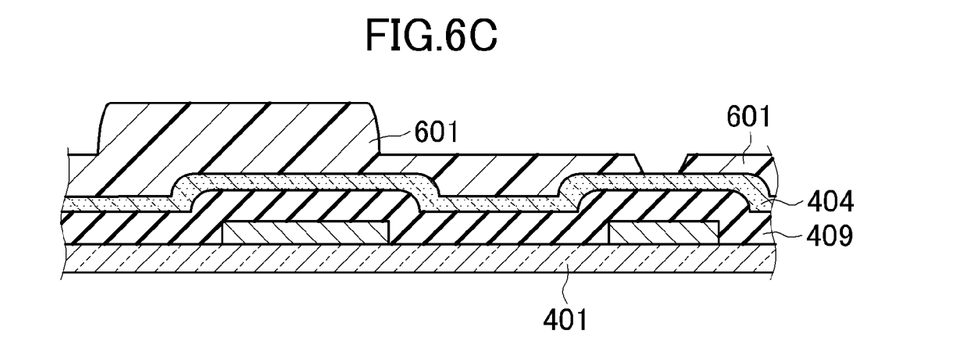
FIG. 6C explains the method for manufacturing the TFT and the gate through-hole in the embodiment.

Next, a resist 601 is formed as shown in FIG. 6C. Specifically, for example, the resist 601 is applied, and thereafter a so-called half exposure mask (not shown) is aligned with the glass substrate 401. For example, a transparent area, a semi-transparent area, and an opaque area are patterned on the mask, and the semi-transparent area blocks about one-half of light. Then, the mask is irradiated with light (exposure). Thereafter, the resist 601 at an unnecessary portion is removed (development). As a result, the resist 601 having different thicknesses is formed, as shown in FIG. 6C, except for an area where the gate through-hole 407 is formed. Specifically, for example, the thickness of the resist, which is formed in an area obtained by removing the area where the gate through-hole 407 is formed from an area where the TFT 109 is not formed, is about half of the thickness of the resist in an area where the TFT 109 is formed.

Figure 6D:
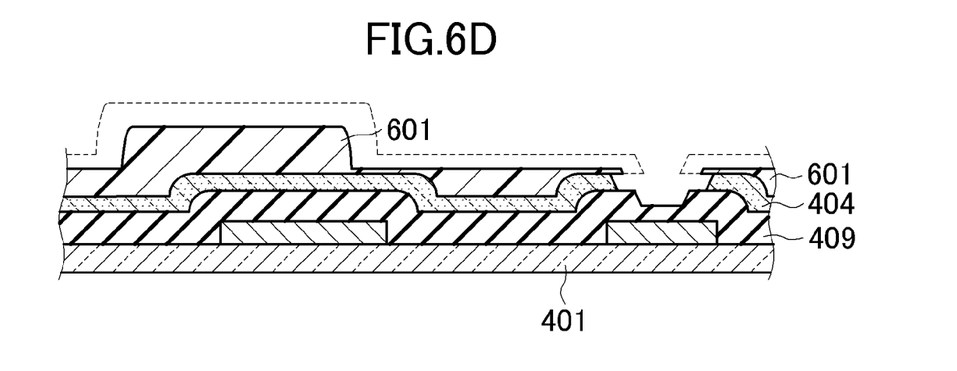
FIG. 6D explains the method for manufacturing the TFT and the gate through-hole in the embodiment.

Next, as shown in FIG. 6D, the semiconductor layer 404 at a portion corresponding to the area where the gate through-hole 407 is formed is removed by etching. In this case, the top of the resist 601 is also removed by an amount corresponding to a predetermined thickness.

Figure 6E:
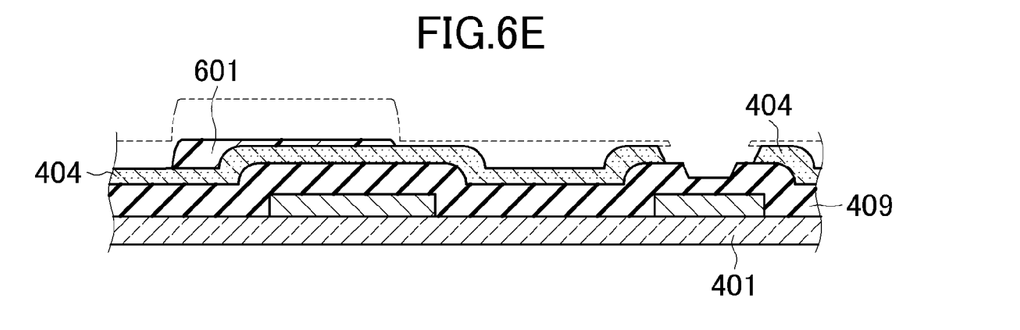
FIG. 6E explains the method for manufacturing the TFT and the gate through-hole in the embodiment.

Next, as shown in FIG. 6E, the resist 601 in the area other than the area where the TFT 109 is formed, that is, the resist that is formed to have about half thickness compared to the thickness of the area where the TFT is formed, is removed.

Figure 6F:
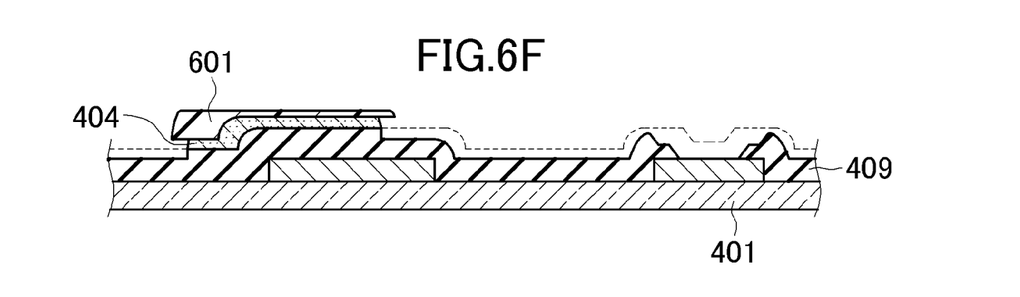
FIG. 6F explains the method for manufacturing the TFT and the gate through-hole in the embodiment.

Next, as shown in FIG. 6F, the semiconductor layer 404 in the area other than the area where the TFT 109 is formed is removed by etching. In this case, the taper angles of the first to third taper portions 504, 505, and 506 are determined as shown in FIG. 5.

Specifically, at a portion of the gate insulating film 409 where the semiconductor layer 404 is stacked in FIG. 6E, the amount (thickness) of the gate insulating film 409 removed by etching is smaller than that of a portion where the semiconductor layer 404 is not stacked. Moreover, at the portion where the semiconductor layer 404 is not stacked, a similar amount (thickness) of the gate insulating film 409 is removed. However, as shown in FIG. 6E, since the portion where the semiconductor layer 404 is not stacked has a step, the thickness varies. With this configuration, for example, it is possible to form the gate through-hole 407 having the first to third taper portions 504, 505, and 506 having the first to third taper angles 501, 502, and 503, respectively, as shown in FIG. 5.

Figure 6G:
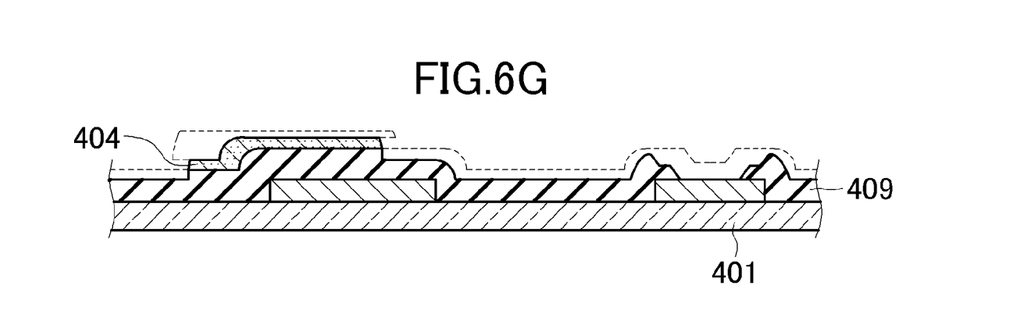
FIG. 6G explains the method for manufacturing the TFT and the gate through-hole in the embodiment.
Figure 6H:
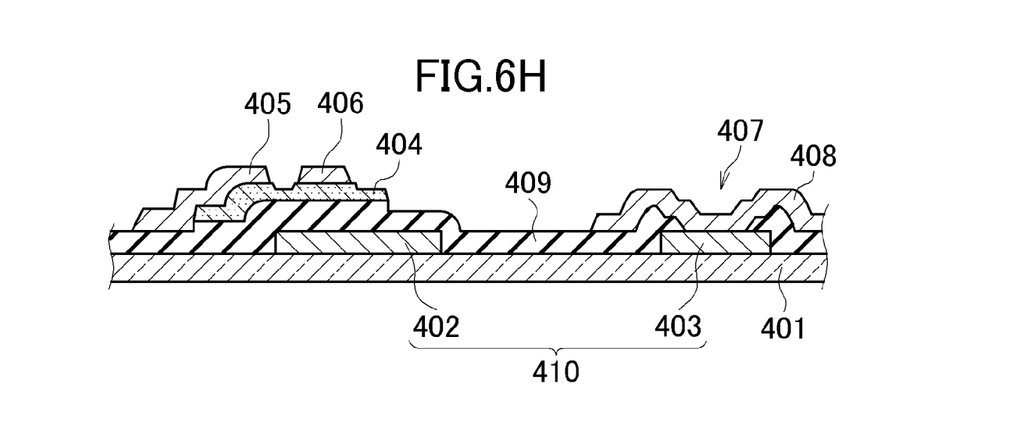
FIG. 6H explains the method for manufacturing the TFT and the gate through-hole in the embodiment.

Next, as shown in FIG. 6G, the remaining resist 601 is removed. Thereafter, as shown in FIG. 6H, an electrode layer for forming the source and drain electrodes 405 and 406 and the wiring portion 408 are formed, and the source and drain electrodes 405 and 406 for forming the TFT 109 and the wiring portion 408 to be connected to the electrode layer 403 via the gate through-hole 407 are formed through a photolithography process and an etching process. As the electrode layer, for example, a metal composed of Mo, W, Al, Cu, or a Cu—Al alloy, or one obtained by appropriately stacking those metals may be used.

As described above, the TFT 109 and the gate through-hole 407 connected to the wiring portion 408 can be simultaneously formed on the substrate 401. Moreover, the number of photolithography processes in a method for manufacturing a display device including the TFT 109 and the gate through-hole 407 can be further reduced. As a result, an improvement of about 12% to 20% in productivity (an increase in the number of inputs) can be achieved. Moreover, by forming the gate through-hole 407 having a step shape as described above, the aspect ratio can be reduced to 0.02 or less. Therefore, contact failure due to insufficient coverage of the wiring portion 408 stacked on the top of the electrode 403 can be mended, and a short of the wiring portion 408 at the taper portion of the upper portion of the gate through-hole 407 can be more effectively prevented. Moreover, the diameter (diameter at a portion contacting the electrode portion) of the gate through-hole 407 can be formed to be 7.6 μm or less so as to easily mount on a portable terminal or the like whose refinement is progressing.

The invention is not limited to the embodiment, and various modifications are possible. For example, the configuration of the embodiment may be replaced with substantially the same configuration as that shown in the embodiment, a configuration providing the same operational effect, or a configuration capable of achieving the same object.

For example, a liquid crystal display device has been described in the above as an example of a display device. However, the invention is not limited to this, and may be applied to, for example, display devices using various kinds of light emitting elements such as an organic EL element, an inorganic EL element, and an FED (Field-Emission Device). Moreover, the TFT 109 in the embodiment may be the TFT 109 in the pixel area 130 or may be applied to the TFT 109 forming the gate driver 104, the drain driver 106, or the like. Moreover, a gate through-hole formed in a gate insulating film has been described in the embodiment described above. However, the invention can be applied generally to a configuration in which conductive films formed on and below any stacked insulating film via the stacked insulating film are connected with each other via a through-hole formed in the stacked insulating film.

Moreover, the display device in the embodiment which has been described above can be applied to display devices for displaying various kinds of information, such as displays for personal computers, displays for receiving TV broadcasts, and displays for displaying advertisements. Moreover, the display device can be adopted as a display portion of electronic apparatuses such as digital still cameras, video camcorders, car navigation systems, car audio systems, game machines, and personal digital assistants.

What is claimed is:

1. A display device comprising:
   a thin film transistor having a gate electrode formed above a substrate, a semiconductor layer formed above the gate electrode, a gate insulating film formed between the semiconductor layer and the gate electrode, a source electrode, and a drain electrode, the source electrode and the drain electrode being formed on an upper surface of the semiconductor layer;
   an electrode layer formed in the same layer as the gate electrode and at a predetermined position on the substrate so as to be in contact with a lower portion of the gate insulating film;
   a through-hole formed on the top of the electrode layer and formed in the gate insulating film; and
   a wiring film connected to the electrode layer via the through-hole,
   wherein the wiring film is formed of a metal layer in the same layer as the source electrode and the drain electrode, and is directly in contact with the gate insulating film and the electrode layer at the through-hole;
   wherein based on a surface of the substrate, the through-hole includes:
   a first taper portion having a first taper angle,
   a second taper portion formed higher than the first taper portion and having a second taper angle different from the first taper angle, and
   a third taper portion formed higher than the second taper portion and having a third taper angle different from the second taper angle,
   wherein the through-hole is formed only in the gate insulating film which is a single layer, and the first taper portion, the second taper portion, and the third taper portion are formed in the single layer gate insulating film.

2. The display device according to claim 1, wherein the first taper angle is greater than the second taper angle.

3. The display device according to claim 1, wherein the third taper angle is greater than the second taper angle.

4. The display device according to claim 1, wherein the second taper angle is 10° or less.

5. The display device according to claim 1, wherein the diameter of the through-hole at a portion contacting the electrode layer is 7.6 μm or less.

6. The display device according to claim 1, wherein the through-hole is arranged in a frame area positioned at the periphery of a display area of the display device.

7. The display device according to claim 1, the wiring film and the gate insulating film are in contact with each other on an outside of the through-hole in a plane.

* * * * *